United States Patent [19]

Boleky, III

[11] 3,745,647

[45] July 17, 1973

[54] FABRICATION OF SEMICONDUCTOR DEVICES

[75] Inventor: Edward Joseph Boleky, III, Cranbury, N.J.

[73] Assignee: RCA Corporation, New York, N.Y.

[22] Filed: Oct. 7, 1970

[21] Appl. No.: 78,806

[52] U.S. Cl. .................................... 29/571, 29/571

[51] Int. Cl. .............................................. B01j 17/00

[58] Field of Search .............................. 29/571, 578; 317/235 B

[56] References Cited

UNITED STATES PATENTS

| | | | |
|---|---|---|---|
| 3,566,517 | 3/1971 | Brown et al. | 29/571 |
| 3,475,234 | 10/1969 | Kerwin | 148/187 |
| 3,566,457 | 3/1971 | Engeler | 29/571 |
| 3,576,478 | 4/1971 | Watkins | 317/235 |

*Primary Examiner*—Charles W. Lanham
*Assistant Examiner*—W. Tupman
*Attorney*—Glenn H. Bruestle

[57] ABSTRACT

An insulated gate, field effect transistor is fabricated by covering a surface of a body of doped semiconductor material with a first layer of a dielectric material covered by a second layer of a dielectric material masking layer covered by a third layer of a highly doped semiconductor material. The third layer is defined to provide a gate electrode having exposed sides, and the sides are covered with a protective thermally grown oxide layer, the masking second layer preventing the growth of the oxide layer on the surface of the body. Then, using the gate electrode as a mask, the second and first layers are removed to provide a gate structure comprising the three layers, and to expose surface portions of the body adjacent to the gate structure. Thereafter, the body is doped to provide the source and drain regions of the transistor, and metal contacts are provided covering the exposed surface portions.

6 Claims, 7 Drawing Figures

INVENTOR.
Edward J. Boleky, III
BY M. Y. Epstein
ATTORNEY

FABRICATION OF SEMICONDUCTOR DEVICES

BACKGROUND OF THE INVENTION

The invention herein disclosed was made in the course of or under a contract or subcontract thereunder with the Department of the Air Force.

This invention relates to the fabrication of semiconductor devices, and particularly to the fabrication of insulated gate, field effect transistors.

One type of insulated gate, field effect transistor comprises a body of semiconductor material having, at one surface thereof, source and drain regions of one type conductivity separated by a channel region of the other type conductivity. Covering the surface of the body over the channel region is a gate insulator of a dielectric material covered, in turn, by a gate electrode. Preferably, for optimum device performance, the gate electrode should be exactly aligned with the channel region, neither extending over nor falling short of the source and drain regions.

One process for fabricating such devices comprises providing a layer of a dielectric material on a surface of a body of doped semiconductor material and providing a gate electrode on the dielectric layer. Then, using the gate electrode as a mask, the dielectric layer is defined to provide the gate insulator, and conductivity modifiers are caused to diffuse into the semiconductor body on either side of the composite electrode-insulator gate structure to provide the source and drain regions. The portion of the semiconductor body covered by the gate structure is masked from the conductivity modifiers and comprises a channel region which is aligned with the gate electrode.

One problem with the above-described process is that while the gate structure is used as a mask in the doping of the source and drain regions, thus providing substantial alignment of the channel region with the gate electrode, some lateral diffusion of the conductivity modifiers under the gate structure does occur. This lateral diffusion results in an extension of the source and drain regions underneath the gate electrode and gives rise to an undesired amount of overlap between the gate electrode and the source and drain regions.

DESCRIPTION OF PREFERRED EMBODIMENTS OF THE INVENTION

Figures 1, 2, 3, 4, 5, 6, 7:
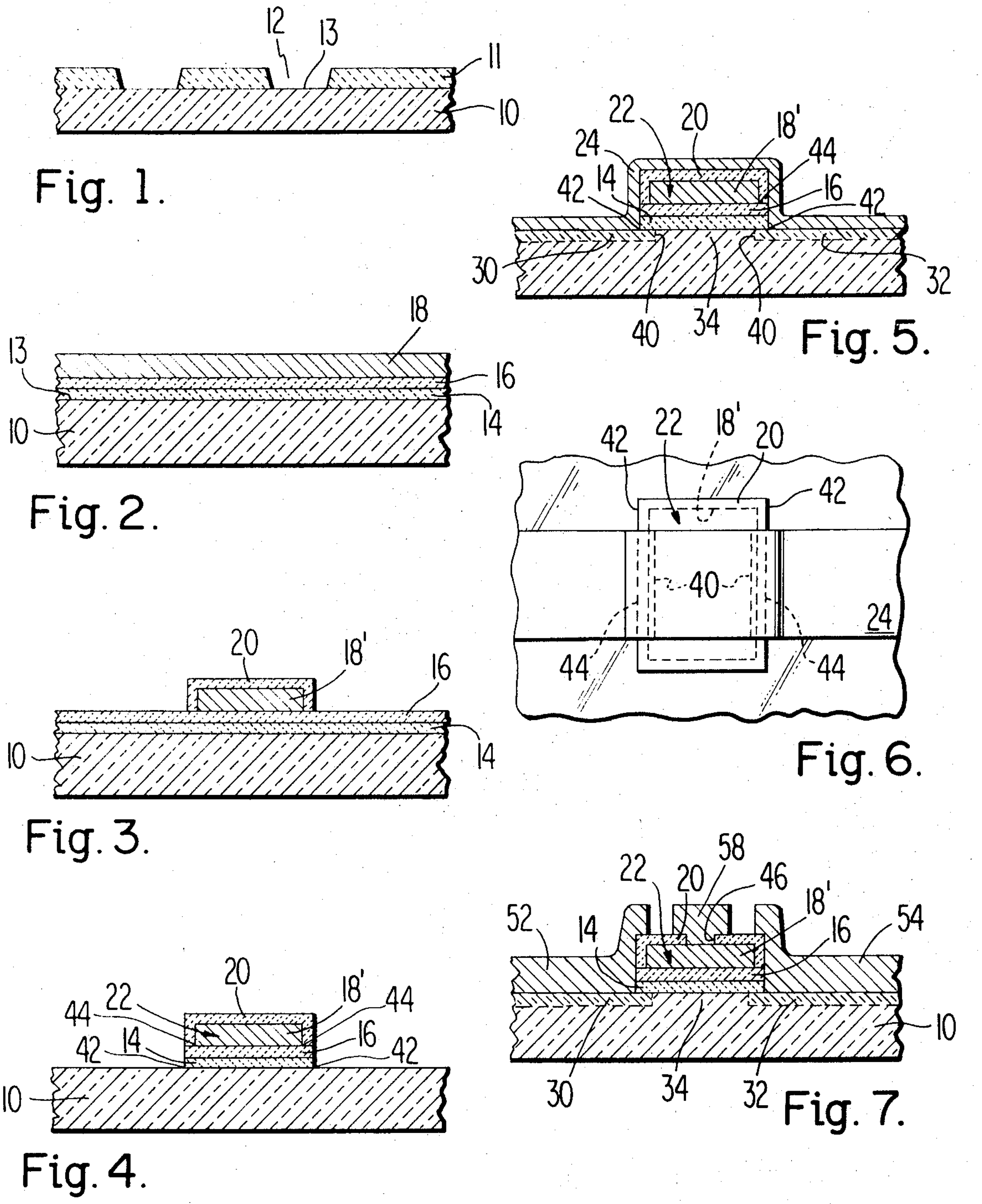
FIG. 1 is a cross-sectional view of a semiconductor material wafer workpiece at an early step in a device processing sequence in accordance with one embodiment of the instant invention.
FIG. 2 is a cross-sectional view, on an enlarged scale, of a portion of the workpiece shown in FIG. 1, but showing the workpiece at a later step in the processing sequence.
FIGS. 3, 4, and 5 are views similar to that of FIG. 2 but showing successive steps in the processing sequence.
FIG. 6 is a plan view of FIG. 5.
FIG. 7 is a view similar to that of FIGS. 3, 4, and 5, but at a still later step in the processing sequence.

Shown in FIG. 1 is a body 10 of a doped semiconductor material, e.g., silicon, germanium, or the like. The body 10, in this embodiment, is a wafer of silicon cut from a silicon ingot in known fashion, the body 10 being doped with a P type conductivity modifier, e.g., boron, at a concentration of $1 \times 10^{16}$ atoms/cm$^3$. Covering one surface of the wafer 10 is a relatively thick, e.g., 10,000 A, layer 11 of silicon dioxide having a number of openings 12 therethrough exposing surface portions 13 of the wafer 10. Semiconductor devices fabricated on the wafer 10, in accordance with the instant embodiment of the invention, are disposed within the openings 12, one device per opening. The purpose of the layer 11 is to provide electrical isolation of the various devices from one another.

Although only two openings 12 are shown, in actual practice, a much larger member of openings 12 are generally used.

Known techniques can be used to provide the workpiece shown in FIG. 1.

Shown in FIG. 2 is the bottom of one of the openings 13 (FIG. 1) after the preformance of certain steps on the workpiece. Thus, covering the previously exposed surface portion 13 of the body 10 is a first thin layer 14 of a dielectric material, e.g., an 800 A thick layer of silicon dioxide, covered by a second thin layer 16 of a dielectric material which can serve as a protective mask for the first layer 14, e.g., a 250 A thick layer of silicon nitride.

Although the use of the protective layer 16 is preferred, this layer, as described hereinafter, can be omitted.

Covering the two layers 14 and 16 is a third, relatively thick layer 18, e.g., 1 micron, of an electrically conductive material, e.g., highly doped silicon or germanium, upon which an oxide of the material can be thermally grown. In this embodiment, the layer 18 comprises polycrystalline silicon of 0.001 ohm-cm P type conductivity. Layers 18 having other conductivity or type of conductivity characteristics can be used depending upon the particular device being fabricated.

Techniques for providing the workpiece shown in FIG. 2 are known. The silicon dioxide layer 14, along with the silicon nitride layer 16, form, as described hereinafter, the gate insulator of the transistor to be formed. Accordingly, the layer 14 is preferably provided by known thermal growth techniques, such techniques, as known, providing a layer of good insulating quality. The silicon nitride layer 16 can be provided, for example, by known deposition techniques.

Then, using known photolithographic techniques, the third layer 18 is defined (FIGS. 3 and 6) to provide a rectangular gate electrode 18' of the transistor to be formed, and the workpiece is heated to a temperature of about 900° C. in a water vapor atmosphere to provide a relatively thick layer 20, e.g., 8,500 A, of thermally grown silicon dioxide enveloping the otherwise exposed sides of the gate electrode 18'. During this thermal growth process, the layer 16 of silicon nitride protects the silicon body 10 from being oxidized and additionally serves as a diffusion mask to prevent the conductivity defining atoms in the gate electrode 18' from diffusing through the silicon dioxide layer 14 and into the body 10.

The enclosing of exposed sides of the gate electrode prior to the formation of the source and drain regions of the transistors differs from the prior art practice wherein the gate protective oxide layer is provided after the source and drain regions are formed. As described hereinafter, this change from the prior art practice provides important advantages.

Thereafter, using the silicon dioxide coated gate electrode 18' as an etch mask, first the previously exposed portions of the silicon nitride layer 16 are removed, using hot phosphoric acid, and then the underlying portions of the silicon dioxide layer 14 thus exposed are also removed, using buffered hydrofluoric acid. While the etchant used to remove the silicon dioxide layer 14 also attacks the silicon dioxide layer 20 covering the gate electrode 18', the etching process is discontinued as soon as the much thinner layer 14 is removed, whereby a substantial thickness of the layer 20, e.g., 7,500 A, remains. Thus, no masking of the layer 20 is required during these etching steps. At the conclusion of these steps, as shown in FIG. 4, a composite gate structure 22 is provided comprising the layer 14 of silicon dioxide, the layer 16 of silicon nitride, the gate electrode 18', and the gate electrode covering layer 20 of silicon dioxide. The gate electrode 18' has a pair of oppositely disposed edges 44 disposed laterally inwardly of oppositely disposed edges 42 of the composite gate structure 22.

The source and drain regions of the transistor are next formed. This is accomplished, for example, by depositing on the workpiece a layer 24 (FIG. 5) of silicon dioxide having a high concentration, e.g., in the order of $1 \times 10^{20}$ atoms/cc of N type conductivity impurities, e.g., phosphorus, and, using known photolithographic techniques, defining the layer 24 to cover part (FIG. 6) of the gate structure 22 and to extend beyond two opposite sides thereof. Thereafter, the workpiece is heated in an inert atmosphere, e.g., argon, at 1,100° C., to drive the impurities in the layer 24 into the silicon body. Where the impurities diffuse into the body 10, i.e., within regions 30 and 32 on opposite sides of the masking gate structure 22 (FIG. 5), the conductivity of the body, originally of P type, is changed to N type. The two regions 30 and 32 comprise the source and drain regions of the transistor being fabricated, the region 34 between the regions 30 and 32 being the transistor channel region, and the boundries 40 between the region 34 and each region 30 and 32 comprising a P-N junction.

Alternatively, the source and drain regions 30 and 32 can be provided by placing the workpiece in a diffusion furnace where the conductivity defining impurity is provided from either liquid, solid, or gaseous sources.

One advantage of the use of the protective layer 20 is that no doping of the gate electrode 18' occurs during the formation of the source and drain regions. Thus, the conductivity characteristics of the gate electrode 18' are not affected by the conductivity characteristics of other portions of the device and can be selected as desired. This provides great flexibility in the design of devices made in accordance with the instant invention.

Because the impurities diffuse laterally, as well as downwardly, the junctions 40 of the regions 30 and 32 with the region 34 are disposed inwardly of the edges 42 of the gate structure 22.

As previously noted, a problem with prior art fabricated devices is that the lateral diffusion of the source and drain conductivity modifiers gives rise to excessive overlap between the gate electrode and the source and drain regions. This is undesirable, as known, since it increases the inter-electrode capacitance of the device, thereby reducing the device high frequency performance.

In accordance with the instant embodiment, however, the edges 44 of the gate electrode 18', as previously noted, are disposed inwardly of the edges 42 of the gate structure 22, the location of the edges 42 relative to the edges 44 being determined by the thickness of the gate protective oxide layer 20. Thus, knowing the amount of lateral diffusion which will occur, this being substantially equal to the depth of the source and drain regions 30 and 32, e.g., 1 micron (determined by the desired device characteristics), a thickness of the layer 20 is selected which will result in the junctions 40 being disposed just inwardly of the gate electrode 18' edges 44. Although exact alignment of the junctions 40 with the gate electrode edges 44 would be preferred, owing to unavoidable processing variations, exact positioning of the junctions cannot be obtained on a reproducible basis, and the process is designed to produce some overlap, e.g., 2,500 A, of the gate electrode 18' with the source and drain regions. With respect to device performance, such a condition of overlap is preferred to a condition in which the source and drain regions 30 and 32 lie outside a projection of the gate electrode 18'.

To complete the device, the doping layer 24 is removed, as with buffered hydrofluoric acid, an opening 46 (FIG. 7) is made through the protective oxide 20 to expose a surface portion of the gate electrode 18', a layer of metal, e.g., a 10,000 A thick layer of aluminum, is deposited on the workpiece, and, using known photolithographic steps, the metal layer is defined to provide contacts 52 and 54 for the source 30 and drain 32 regions, respectively, and a contact 58 for the gate electrode 18'.

A further advantage of the hereindescribed process is that since the gate electrode 18' is already completely enclosed by the insulating layer 20 prior to the application of the metal layer, there is comparatively little danger of shorting either the source 30 or drain 32 regions with the gate electrode 18' via the metal contacts provided on the workpiece surface. For example, as shown, the metal contacts 52 and 54 can even partially overlap the gate structure 22 with little ill effect, the relatively thick oxide layer 20 preventing excessive capacitive coupling between the metal contacts 52 and 54 and the gate electrode 18'. By thus protecting the gate electrode 18', the various metal contacts can be defined with comparatively little regard for accuracy, thus simplifying the process and reducing the cost thereof.

Additionally, contrary to the prior art practice, no protective insulating layer is provided over the source and drain regions 30 and 32. In the prior art process, in which the gate electrode is not enclosed in a protective coating early in the process, as in the instant process, the source and drain regions are provided with a protective layer simultaneously with the provision of the protective layer over the gate electrode. The protective layer covering the source and drain regions is left in place, and contact openings are made through the layer to expose surface portions of the source and drain regions. The opening forming process requires a fair degree of process accuracy (thus adding expense to the process) since if the openings are not properly spaced from the gate electrode, the contact openings can expose both the gate electrode and one of the adjacent regions through the same opening. Thus, the metal contacts extending into the contact opening would cause a shorting of the device. Additionally, owing to the requirement that the source and drain contact openings be spaced from the gate electrode, larger devices must be made than are required with the herein-described process in which the source and drain contacts, as described, can even overlap the gate electrode. Thus, greater packing density of devices, in accordance with the instant invention, can be provided.

As described, one function of the silicon nitride layer 16 (FIG. 3) on the body 10 is to prevent oxidation of the body 10 during the process of thermally growing the silicon dioxide layer 20 on the gate electrode 18'. As previously noted, however, the nitride layer 16 can be omitted. In one such embodiment of the invention, not illustrated, the process of thermally growing the layer 20 on the electrode 18' causes a corresponding increase in thickness of the silicon dioxide layer 14 covering the body 10, the result being that the layer 14 is even thicker than the layer 20. Thereafter, in order to remove portions of the layer 14 to allow doping of the body 10 thereunder while not simultaneously removing the layer 20, the layer 20 is covered with a protective masking layer. The use of the silicon nitride layer 16 is thus preferred since, for one thing, it avoids the need, as described, for this protective masking operation.

While the invention has been described in connection with the use of a semiconductor material workpiece, the invention also has utility in the fabrication of semiconductor devices formed on insulating substrates. That is, instead of the source and drain regions being formed within a wafer of semiconductor material, as above described, the semiconductor material comprises a thin film on an insulating substrate, e.g., a film of doped silicon on a sapphire substrate, and the source and drain regions are formed in the thin film. Further processes to fabricate the devices on the insulating substrate are substantially identical to the above-described processes used to fabricate the devices on a semiconductor material wafer.

I claim:

1. A method of fabricating a semiconductor device comprising:

providing on a surface of a body of doped semiconductor material a gate structure comprising a first layer of a dielectric material having thereon a shaped member of a conductive material, said dielectric material extending beyond the sides of said member, covering said sides of said member with a protective coating impervious to the diffusion of certain conductivity modifiers therethrough, said dielectric material preventing formation of said protective coating thereon except at the sides of said member, and, thereafter, using said gate structure and said protective coating as a mask, driving said certain conductivity modifiers into said body through portions of said surface and causing said conductivity modifiers to diffuse laterally under said coated gate structure a distance substantially equal to the thickness of said protective coating.

2. A method as in claim 1 including the step of providing conductive contacts covering, and in direct contact with substantially the entire extent of said surface portions.

3. A method of fabricating a field effect transistor comprising:

providing a first layer of a dielectric material covering a surface of a body of doped semiconductor material, providing a second layer of a masking material covering said first layer, providing a third layer of a conductive material covering said second layer, defining said third layer to form a gate electrode having exposed sides, providing a protective coating impervious to the diffusion of certain conductivity modifiers therethrough on exposed sides of said gate electrode, said masking second layer preventing formation of said protective coating on portions of said body covered by said second layer, using said coated gate electrode as a mask, removing portions of said second and first layers to expose surface portions of said body immediately adjacent to said coated sides of said gate electrode, and driving said certain conductivity modifiers into said body through said exposed surface portions.

4. The method of claim 3 wherein said conductivity modifiers are caused to diffuse laterally under said gate structure a distance substantially equal to the thickness of said protective coating.

5. The method of claim 3 including the step of providing conductive contacts covering, and in direct contact with substantially the entire extent of said surface portions.

6. A method as in claim 1 wherein said conductive material is silicon, and said covering step comprises thermally growing a layer of silicon dioxide thereover.

* * * * *